United States Patent
Pal

(10) Patent No.: US 9,042,097 B2
(45) Date of Patent: May 26, 2015

(54) TWO-PHASE ELECTRONIC COMPONENT COOLING ARRANGEMENT

(75) Inventor: Debabrata Pal, Hoffman Estates, IL (US)

(73) Assignee: HAMILTON SUNDSTRAND CORPORATION, Windsor Locks, CT (US)

( * ) Notice: Subject to any disclaimer, the term of this patent is extended or adjusted under 35 U.S.C. 154(b) by 450 days.

(21) Appl. No.: 13/474,266

(22) Filed: May 17, 2012

(65) Prior Publication Data

US 2013/0308271 A1 Nov. 21, 2013

(51) Int. Cl.
*H05K 7/20* (2006.01)

(52) U.S. Cl.
CPC .................................. *H05K 7/20936* (2013.01)

(58) Field of Classification Search
CPC .......... H05K 7/20336; H05K 7/20736; H05K 7/209; H05K 7/20; H05K 7/20936; H05K 7/20409; F28D 2021/0028; F28D 15/043
See application file for complete search history.

(56) References Cited

U.S. PATENT DOCUMENTS

| | | | | |
|---|---|---|---|---|
| 3,714,981 | A * | 2/1973 | Noren | 165/47 |
| 4,047,198 | A * | 9/1977 | Sekhon et al. | 257/713 |
| 4,671,349 | A * | 6/1987 | Wolk | 165/47 |
| 4,910,642 | A | 3/1990 | Downing | |
| 4,944,344 | A | 7/1990 | Crowe | |
| 4,947,287 | A | 8/1990 | Hoppe | |
| 4,956,626 | A | 9/1990 | Hoppe et al. | |
| 5,088,005 | A | 2/1992 | Ciaccio | |
| 6,076,595 | A * | 6/2000 | Austin et al. | 165/104.26 |
| 6,317,321 | B1 * | 11/2001 | Fitch et al. | 361/700 |
| 7,369,410 | B2 * | 5/2008 | Chen et al. | 361/701 |
| 7,491,916 | B1 | 2/2009 | Barber et al. | |
| 7,495,914 | B2 | 2/2009 | Tilton et al. | |
| 7,602,608 | B2 | 10/2009 | Tilton et al. | |
| 8,124,113 | B2 | 2/2012 | Peyton et al. | |
| 2009/0008063 | A1 | 1/2009 | Salinas et al. | |

* cited by examiner

*Primary Examiner* — Gregory Thompson
(74) *Attorney, Agent, or Firm* — Carlson, Gaskey & Olds, P.C.

(57) ABSTRACT

An electronic component assembly includes a housing that provides a cavity filled with a cooling fluid that has a liquid phase and a vapor phase. An electronic element is arranged in the cavity and is configured to generate heat. A wicking material is arranged in the cavity between the housing and the electronic device. The cavity provides a gap adjacent to the wicking material. The wicking material is configured to absorb the liquid phase, and the vapor phase is provided in the gap.

16 Claims, 2 Drawing Sheets

TWO-PHASE ELECTRONIC COMPONENT COOLING ARRANGEMENT

BACKGROUND

This disclosure relates to an electronic component cooling arrangement. More particularly, the disclosure relates to using a two-phase fluid cooling arrangement to cool the electronic component.

Devices, such as motor controllers for motors, typically include sophisticated electronic component assemblies made up of multiple electronic elements, which generate significant heat. This heat must be controlled sufficiently to prevent damage to the electronic elements. Typically, devices such as motor controllers are mounted on cooling plates arranged in a cooling loop filled with a cooling fluid. Increases in power dissipation density in magnetic assemblies require innovative thermal management in order to keep an inductor core and its winding, for example, within safe temperature limits. Expensive housing structure and potting compounds are used for thermal management. The potting material adds significant weight to the overall electronic components assembly.

SUMMARY

In one exemplary embodiment, an electronic component assembly includes a housing that provides a cavity filled with a cooling fluid that has a liquid phase and a vapor phase. An electronic element is arranged in the cavity and is configured to generate heat. A wicking material is arranged in the cavity between the housing and the electronic device. The cavity provides a gap adjacent to the wicking material. The wicking material is configured to absorb the liquid phase, and the vapor phase is provided in the gap.

BRIEF DESCRIPTION OF THE DRAWINGS

The disclosure can be further understood by reference to the following detailed description when considered in connection with the accompanying drawings wherein.

DETAILED DESCRIPTION

Figure 1:
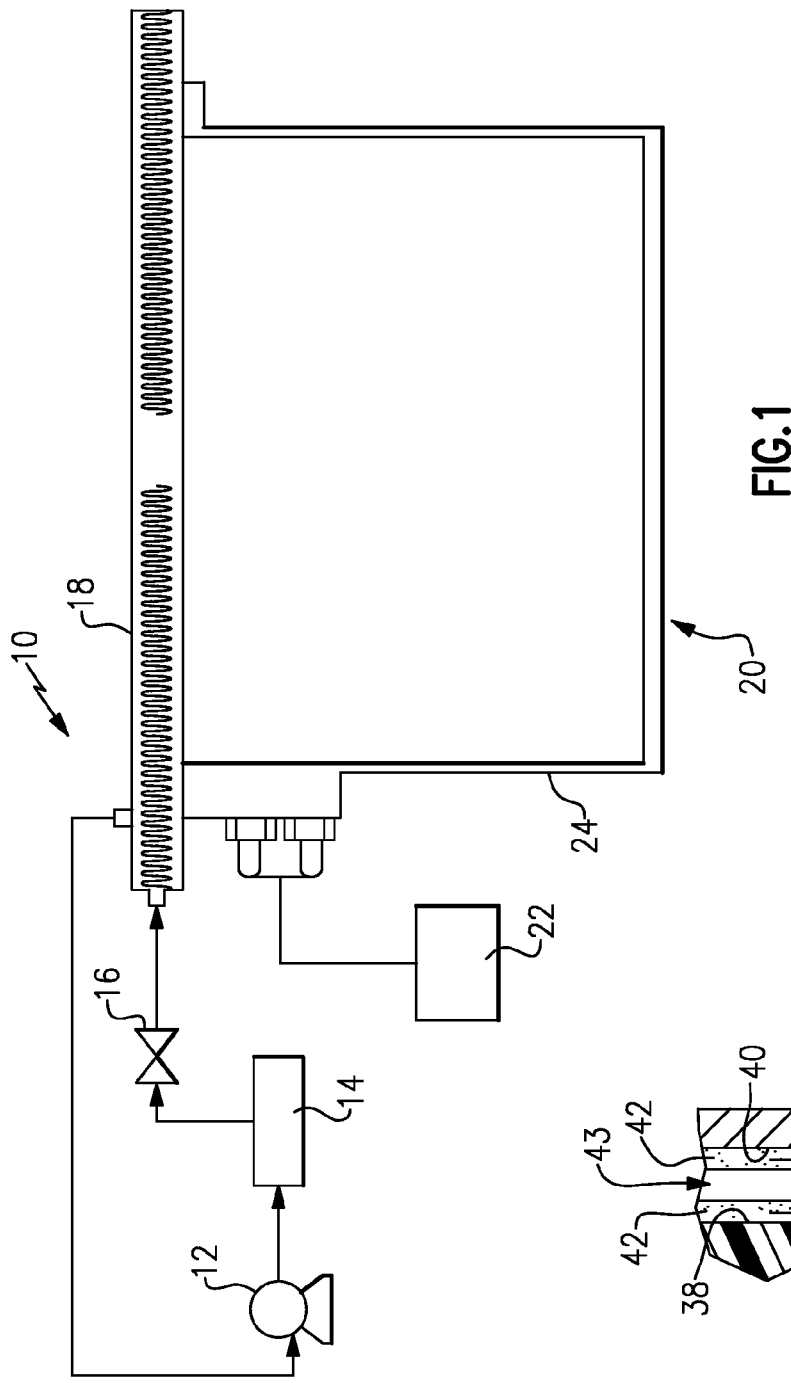
FIG. 1 is a schematic view of a cooling system used to cool at least one electronic element of an electronic component assembly.

FIG. 1 schematically illustrates a cooling system 10. The cooling system 10 includes a pump 12 providing a cooling fluid to a liquid to air heat exchanger 14. The cooled fluid flows through a flow metering orifice 16 to a cold plate 18 where it receives heat rejected from an electronic element 20 mounted to the cold plate 18. Fluid from the cold plate 18 returns to the pump 12. The electronic element 20 may be part of a motor controller that is electrically connected to a component 22, such as a motor.

Figure 2A:
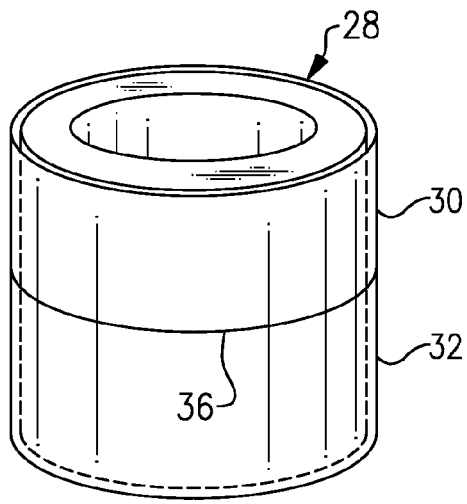
FIGS. 2A and 2B are respectively perspective and side elevational views of a core housing.
Figure 2B:
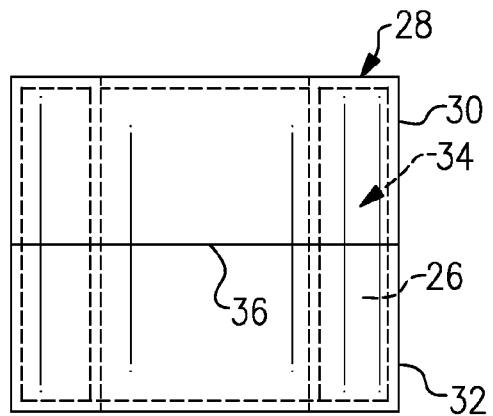

In one example, the electronic element 20 is an inductor arranged in an inductor housing 24. The inductor housing 24 includes a core housing 28 providing a cavity 34 having a core 26 arranged within the cavity 34, which is illustrated in more detail in FIGS. 2A and 2B. In the example, the core housing 28 and core 26 provide an annular shape, although it should be understood that other shapes, such as double-C shapes, may be used.

The core 26 may be constructed from material, such as a soft magnetic nanocrystalline material, for example, VITROPERM. The core housing 28 may be a plastic material, such as polyether ether ketone (PEEK). The first and second housing portions 30, 32 may be secured to one another in a suitable manner, such as welding at the portions to one another at a seam 36 to completely enclose and seal the cavity 34.

A two-phase cooling fluid, such as a fluorocarbon liquid (e.g., FC-72) fills at least a portion of the cavity 34. The cooling fluid includes both liquid and vapor phases during a normal operation of the electronic element, creating a heat pipe. In one example, the cavity 34 is only partially filled with the cooling fluid, such as 20-30% of the cavity volume.

Wire windings 58 (FIG. 4) are wrapped about the core housing 28 to provide a toroidal shape. The wire wound core housing 28 is arranged in the inductor housing 24 to insulate the wire windings 58 from the surrounding environment.

Figure 3:
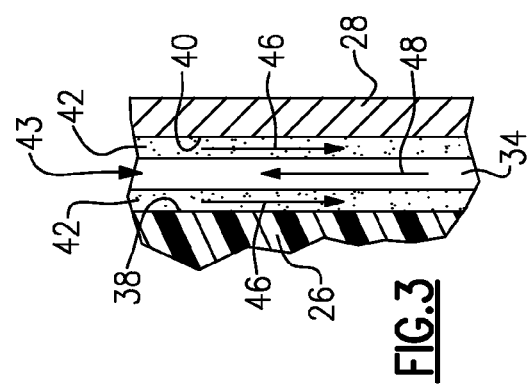
FIG. 3 is an enlarged cross-sectional view of a portion of the electronic component assembly shown in FIG. 4.
Figure 4:
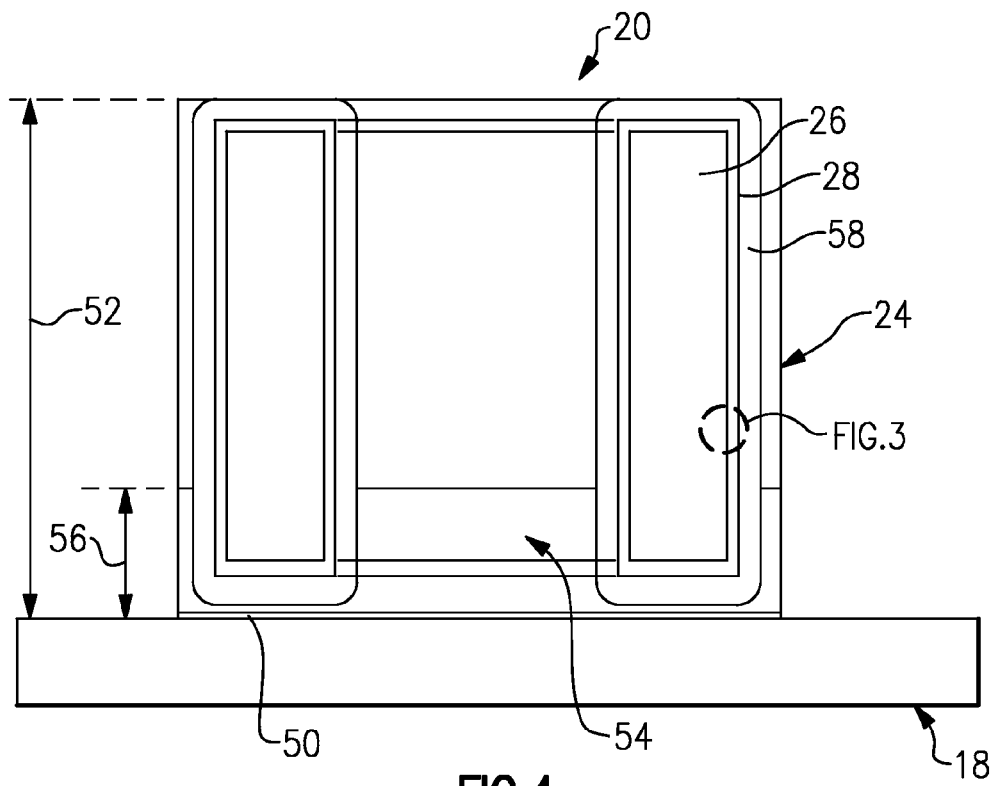
FIG. 4 is a schematic view of the electronic element of FIG. 1 mounted to a cold plate.

Referring to FIGS. 3 and 4, the core 26 and core housing 28 respectively provide first and second surfaces 38, 40 having a gap 43 between the surfaces. In one example, a wicking material 42 is arranged next to each of the first and second surfaces 38, 40 in spaced relationship relative to one another. In one example, the wicking material 42 may be a sintered metal, such as aluminum or copper. The wicking material 42 may include grooves, provide a mesh or may be micro-machined. In one example, the wicking material 42 is secured to the first and second surfaces 38, 40. A bonding material, such as epoxy, may be used to adhere the wicking material 42 to the first and second surfaces 38, 40. Alternatively, the wicking material 42 may be diffusion-bonded to the first and second surface 38, 40, if desired. It should be understood that the wicking material 42 may be provided on only one of the surfaces or spaced from the surfaces.

As illustrated in FIG. 3, the liquid phase collects in the wicking material 42 and flows downward in the first direction 46 under gravity. As the condensed cooling fluid at the bottom of the cavity 34 heats, the vapor phase flows in the second direction 48. In this manner, the cooling fluid is continually recycled and no external means are needed for circulation of the cooling fluid within the core housing 28.

Returning to FIG. 4, the core housing 28 includes a base 50 that is operatively mounted to the cold plate 18. A potting material 54 encases only a portion of the core housing 28 in the example illustrated. The inductor housing 24 may enclose the core housing 28 and the potting material 54. In one example, the potting material 54 extends from the base 50 a distance 56 that is less than a height 52 of the core housing 28 and, in one example, less than one third of the height 52.

Although an example embodiment has been disclosed, a worker of ordinary skill in this art would recognize that certain modifications would come within the scope of the claims. For that reason, the following claims should be studied to determine their true scope and content.

What is claimed is:

1. An electronic component assembly comprising:
 a housing providing a cavity filled with a cooling fluid having a liquid phase and a vapor phase;
 an electronic device arranged in the cavity and configured to generate heat; and
 a wicking material arranged in the cavity between the housing and the electronic device, the cavity providing a gap adjacent to the wicking material, the wicking material configured to absorb the liquid phase, and the vapor phase is provided in the gap.

2. The electronic component assembly according to claim 1, wherein the electronic device includes a core arranged in the housing, and a wire is wrapped about the core to provide an inductor.

3. The electronic component assembly according to claim 2, wherein the core is annular in shape and the wire provides a toridal shape.

4. The electronic component assembly according to claim 2, wherein the housing is entirely sealed.

5. The electronic component assembly according to claim 4, wherein the housing is constructed from a plastic and includes first and second portions joined at a seam.

6. The electronic component assembly according to claim 1, comprising a cold plate, wherein the housing includes a base operatively mounted to the cold plate.

7. The electronic component assembly according to claim 6, comprising a cooling loop including the cold plate.

8. The electronic component assembly according to claim 1, wherein the wicking material includes a sintered metal.

9. The electronic component assembly according to claim 8, wherein the sintered metal is provided by at least one of aluminum or copper.

10. The electronic component assembly according to claim 1, wherein the cooling fluid fills approximately 20-30% of the cavity.

11. The electronic component assembly according to claim 1, wherein the cooling fluid is a fluorocarbon liquid.

12. The electronic component assembly according to claim 1, wherein the wicking material is secured to both the housing and the electronic device, and the wicking material provides the gap.

13. The electronic component assembly according to claim 1, wherein the liquid phase flows in a first direction and the vapor phase flows in a second direction opposite the first direction.

14. The electronic component assembly according to claim 6, comprising a motor controller mounted to the cold plate, the motor controller including the inductor.

15. The electronic component assembly according to claim 1, comprising a potting material encasing a portion of the housing less than a height of the housing.

16. The electronic component assembly according to claim 15, wherein the potting material encases the housing a distance of less than ⅓ the height.

\* \* \* \* \*